(12) United States Patent
Posner et al.

(10) Patent No.: US 9,804,639 B2
(45) Date of Patent: Oct. 31, 2017

(54) HINGED PORTABLE ELECTRONIC DEVICE WITH DISPLAY CIRCUITRY LOCATED IN BASE

(71) Applicant: Apple Inc., Cupertino, CA (US)

(72) Inventors: Bryan W. Posner, La Selva Beach, CA (US); Dinesh C. Mathew, Fremont, CA (US); Eric L. Benson, San Francisco, CA (US); Jason N. Gomez, Campbell, CA (US); Jun Qi, Cupertino, CA (US); Robert Y. Cao, San Francisco, CA (US); Victor H. Yin, Cupertino, CA (US); Christiaan A. Ligtenberg, San Carlos, CA (US); Wey-Jiun Lin, Los Altos Hills, CA (US)

(73) Assignee: Apple Inc., Cupertino, CA (US)

( * ) Notice: Subject to any disclaimer, the term of this patent is extended or adjusted under 35 U.S.C. 154(b) by 602 days.

(21) Appl. No.: 13/968,254

(22) Filed: Aug. 15, 2013

(65) Prior Publication Data

US 2015/0049275 A1 Feb. 19, 2015

(51) Int. Cl.
*G02F 1/1345* (2006.01)
*G06F 1/16* (2006.01)
(Continued)

(52) U.S. Cl.
CPC .......... *G06F 1/1683* (2013.01); *G02F 1/1368* (2013.01); *G02F 1/13306* (2013.01);
(Continued)

(58) Field of Classification Search
CPC .... G06F 1/1683; G06F 1/1637; G06F 1/1681; G02F 1/13306; G02F 1/1368; H05K 1/148; H05K 2201/10136
(Continued)

(56) References Cited

U.S. PATENT DOCUMENTS

| 5,705,855 A | 1/1998 | Carson et al. |
| 6,025,644 A | 2/2000 | Imaeda |

(Continued)

FOREIGN PATENT DOCUMENTS

| JP | H09015638 A | 1/1997 |
| JP | H10-275030 A | 10/1998 |

(Continued)

*Primary Examiner* — Charles Chang
(74) *Attorney, Agent, or Firm* — Treyz Law Group, P.C.; G. Victor Treyz; Joseph F. Guihan (57) ABSTRACT

An electronic device may have a housing with a lid that rotates relative to a base. A display in the lid may have a thin-film transistor layer. Display driver circuitry may be mounted to the thin-film transistor layer. A display timing controller integrated circuit may be mounted in the base. A rigid flex printed circuit may have a rigid portion in the base to which the display timing controller integrated circuit is mounted and may have a rigid portion in the lid. A flexible printed circuit portion of the rigid flex printed circuit may be used to couple the rigid printed circuit portion in the lid to the thin-film transistor layer. A flexible printed circuit portion of the rigid flex printed circuit that extends between the lid and the base may be formed from a double-shield-layer single-signal-line-layer flexible printed circuit.

19 Claims, 7 Drawing Sheets

(51) Int. Cl.
  *G02F 1/133* (2006.01)
  *G02F 1/1368* (2006.01)
  *H05K 1/14* (2006.01)
(52) U.S. Cl.
  CPC .......... *G06F 1/1637* (2013.01); *G06F 1/1681* (2013.01); *H05K 1/148* (2013.01); *H05K 2201/10136* (2013.01)
(58) Field of Classification Search
  USPC .................................................. 349/149–152
  See application file for complete search history.

(56) References Cited

U.S. PATENT DOCUMENTS

| | | | |
|---|---|---|---|
| 7,573,438 B2 | 8/2009 | Nohara | |
| 8,023,029 B2 | 9/2011 | Joseph | |
| 8,383,230 B2 | 2/2013 | Kita et al. | |
| 8,493,723 B2 | 7/2013 | Sakata et al. | |
| 2002/0176044 A1* | 11/2002 | Lim | G02F 1/1345 349/149 |
| 2003/0193772 A1* | 10/2003 | Thomason | G06F 1/1616 361/679.27 |
| 2004/0183762 A1* | 9/2004 | Kang | G02F 1/133308 345/87 |
| 2006/0164349 A1 | 7/2006 | Hu | |
| 2006/0199443 A1 | 9/2006 | Lo | |
| 2007/0123064 A1* | 5/2007 | Shinoda | H01R 35/02 439/31 |
| 2008/0220626 A1* | 9/2008 | Yeh | H01R 12/62 439/67 |
| 2010/0009730 A1* | 1/2010 | Hashizume | H01Q 1/243 455/575.7 |
| 2010/0289706 A1 | 11/2010 | Hsieh | |
| 2012/0062429 A1* | 3/2012 | Uno | H01Q 1/243 343/702 |
| 2014/0049895 A1* | 2/2014 | Lee | H05K 5/0017 361/679.28 |

FOREIGN PATENT DOCUMENTS

| | | | | |
|---|---|---|---|---|
| JP | 2001083902 A | | 3/2001 | |
| JP | 2004-056011 | * | 2/2004 | ............. F16C 11/04 |
| JP | 2004056011 A | | 2/2004 | |
| JP | 2005092185 A | | 4/2005 | |
| JP | 2008052248 A | | 3/2008 | |
| JP | 2009277623 A | | 11/2009 | |

* cited by examiner

HINGED PORTABLE ELECTRONIC DEVICE WITH DISPLAY CIRCUITRY LOCATED IN BASE

BACKGROUND

This relates generally to electronic devices, and more particularly, to electronic devices with displays.

Electronic devices such as portable computers have displays for displaying images for a user. In a typical configuration, a portable computer housing includes a lid and a base that are attached to each other by a hinge. A keyboard is mounted in the base. The display of the portable computer is mounted in the lid.

There can be challenges involved in conveying signals between circuitry in the base of a portable computer and the display in the lid. Some computers use a bulky wiring harness that includes a coaxial cable. Other computers use a flexible printed circuit cable that is wrapped in a spiral shape. Configurations such as these may allow rotation of the lid relative to the base, but can require bulky hinge structures to provide sufficient space to accommodate the wiring harness or spiral flexible printed circuit. If care is not taken, undesired stresses may sometimes be imposed on cables that extend between the base and lid through a hinge that is subject to periodic movement.

It would therefore be desirable to provide improved ways in which to couple circuitry in the base of an electronic device to a device such as a display in the lid of the electronic device.

SUMMARY

An electronic device may have a housing with a lid that rotates relative to a base about a hinge axis. A display such as a liquid crystal display with a backlight unit may be provided in the lid. The liquid crystal display may have a layer of liquid crystal material interposed between a color filter layer and a thin-film transistor layer.

Some display circuitry such as column driver integrated circuits and other display driver circuitry may be mounted to the thin-film transistor layer. Other display circuitry such as a display timing controller integrated circuit may be mounted in the base. Printed circuit structures may be used in coupling circuitry in the base such as a timing controller or other display circuitry to circuitry in the lid such as display driver circuitry.

The printed circuit structures that are used in coupling circuitry in the base to circuitry in the lid may include a rigid flex printed circuit. The rigid flex printed circuit may have a rigid printed circuit board portion in the base to which the display timing controller integrated circuit is mounted and may have a rigid printed circuit board portion in the lid that helps to distribute signals within the lid. A flexible printed circuit portion of the rigid flex printed circuit may be used to couple the rigid printed circuit board portion in the lid to the thin-film transistor layer. Another flexible printed circuit portion of the rigid flex printed circuit may traverse the hinge axis and may extend between the rigid printed circuit board in the lid and the rigid printed circuit board in the base.

Flexible printed circuit board portions of the rigid flex may have a neutral stress plane that is aligned with a single layer of metal signal lines. Opposing outer metal shielding layers may be provided on the upper and lower surfaces of the flexible printed circuit portion that traverses the hinge axis to help prevent interference between display signals and antenna signals.

Further features of the invention, its nature and various advantages will be more apparent from the accompanying drawings and the following detailed description of the preferred embodiments.

DETAILED DESCRIPTION

Figure 1:
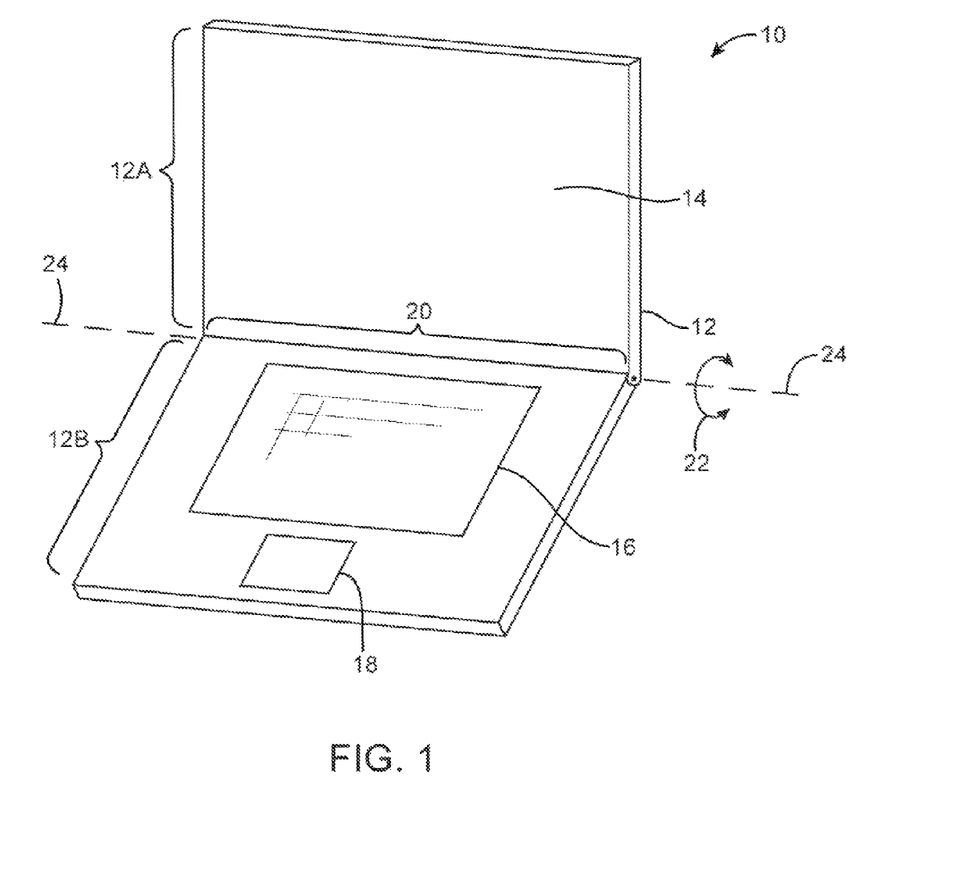
FIG. 1 is a perspective view of an illustrative electronic device such as a laptop computer of the type that may be provided with a conductive path to couple circuitry in a housing base to circuitry in a housing lid in accordance with an embodiment.

An electronic device of the type that may be provided with a display is shown in FIG. 1. As shown in FIG. 1, electronic device 10 may have portions that move relative to each other such as upper housing 12A and lower housing 12B. Lower housing 12B may sometimes be referred to as a main housing, base housing, or base. Upper housing 12A may sometimes be referred to as a lid or display housing.

Electronic device 10 of FIG. 1 may be a portable computer or other electronic device that has a folding lid or may be other electronic equipment.

Components such as keyboard 16 and touchpad 18 may be mounted on lower housing (base) 12B. Base 12B may also be used to house components such as a disk drive, audio components such as speakers, digital and analog signal ports, removable media slots, and other components. Device 10 may have hinge structures in region 20 that allow upper housing (lid) 12A to rotate in directions 22 about rotational axis 24 relative to base 12B. Display 14 may be mounted in lid 12A. Lid 12A may be placed in a closed position by rotating upper housing 12A towards lower housing 12B about rotational axis 24.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components, organic light-emitting diode display components, electrophoretic display components, plasma display components, or other suitable display pixel structures. For example, display 14 may be a color liquid crystal display.

A display cover layer may cover the surface of display 14 or a display layer such as a color filter layer or other portion of a display may be used as the outermost (or nearly outermost) layer in display 14. The outermost display layer may be formed from a transparent glass sheet, a clear plastic layer, or other transparent member.

Figure 2:
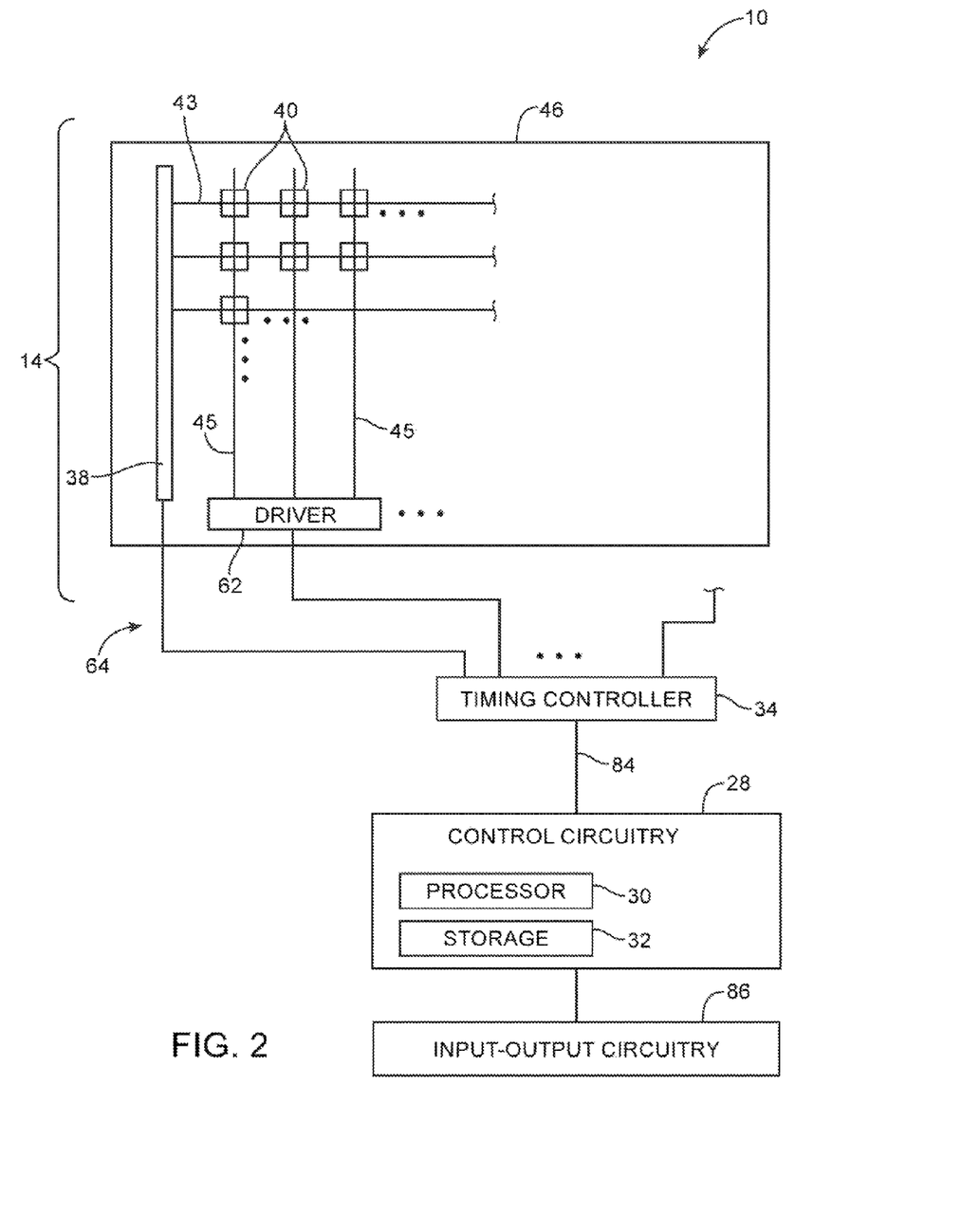
FIG. 2 is a schematic diagram of an illustrative electronic device in accordance with an embodiment.

A schematic diagram of an illustrative configuration that may be used for electronic device 10 is shown in FIG. 2. As shown in FIG. 2, electronic device 10 may include storage and processing circuitry 28 such as control circuitry 28. Control circuitry 28 may include storage 32 such as hard disk drive storage, nonvolatile memory (e.g., flash memory or other electrically-programmable-read-only memory configured to form a solid state drive), volatile memory (e.g., static or dynamic random-access-memory), etc. Processing circuitry 30 in control circuitry 28 may be used to control the operation of device 10. The processing circuitry may be based on one or more microprocessors, microcontrollers, digital signal processors, baseband processors, power management units, audio codec chips, application specific integrated circuits, etc.

Control circuitry 28 may be used to run software on device 10, such as internet browsing applications, voice-over-internet-protocol (VOIP) telephone call applications, email applications, media playback applications (e.g., applications that display moving and still images on display 14), operating system functions, etc. To support interactions with external equipment, control circuitry 28 may be used in implementing communications protocols. Communications protocols that may be implemented using control circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Display 14 may include an array of display pixels such as display pixels 40. Display pixels 40 may be, for example, liquid crystal display pixels formed on one or more display layers 46. Display layers 46 may include polarizers, a color filter layer, a thin-film transistor layer, and a layer of liquid crystal material interposed between the color filter layer and the thin-film transistor layer.

Display circuitry such as timing controller integrated circuit 34, gate driver circuitry 38, and column driver integrated circuits 62 may be used in controlling the array of display pixels 40 in display 14 to present images on display 14 for a user of device 10. Column driver circuitry 62 may provide data signals to data lines 45. Gate driver circuitry 38 may be used to assert a scan signal on gate lines 43 (e.g., gate driver circuitry 38 may take each gate line high in sequence to load data on lines 45 into the pixels of the row associated with that gate line). Gate driver circuitry 38 and/or column driver circuitry 62 may be formed from thin-film circuits on a thin-film transistor layer or other substrate in display layers 46 and/or may be formed from integrated circuits mounted the thin-film transistor layer or other substrate in display layers 46 (e.g., on a glass substrate in a thin-film transistor layer that contains thin-film transistors associated with display pixels 40). Integrated circuits such as column driver integrated circuits may be attached to the thin-film transistor layer in display layers 46 using anisotropic conductive film (ACF) or solder joints (i.e., using a chip-on-glass arrangement).

Signal lines in communications path 64 may be used to couple display circuitry such as display timing controller integrated circuit 34 to display driver circuitry in display 14 such as column drivers 62 and/or gate drivers 38. Path 64 may be formed from metal traces on one or more layers of a flexible printed circuit cable or other signal paths. Timing controller integrated circuit 34 may be coupled to control circuitry 28 via signal lines in communications path 84 (e.g., printed circuit traces, etc.).

Circuitry 28 may be coupled to input-output circuitry 86. Input-output circuitry 86 may be used to allow data to be supplied to device 10 and to allow data to be provided from device 10 to external devices. Input-output circuitry 86 may include input-output devices such as touch screens, buttons, joysticks, click wheels, scrolling wheels, touch pads, key pads, keyboards, light-emitting diodes and other status indicators, data ports, and audio components such as microphones and speakers. Input-output circuitry 86 may also include sensors. For example, input-output circuitry 86 may include an ambient light sensor, a proximity sensor, an accelerometer, and other sensor structures. Wireless communications circuitry and other communications circuitry in input-output circuitry 86 may allow device 10 to communicate with external equipment.

Figure 3:
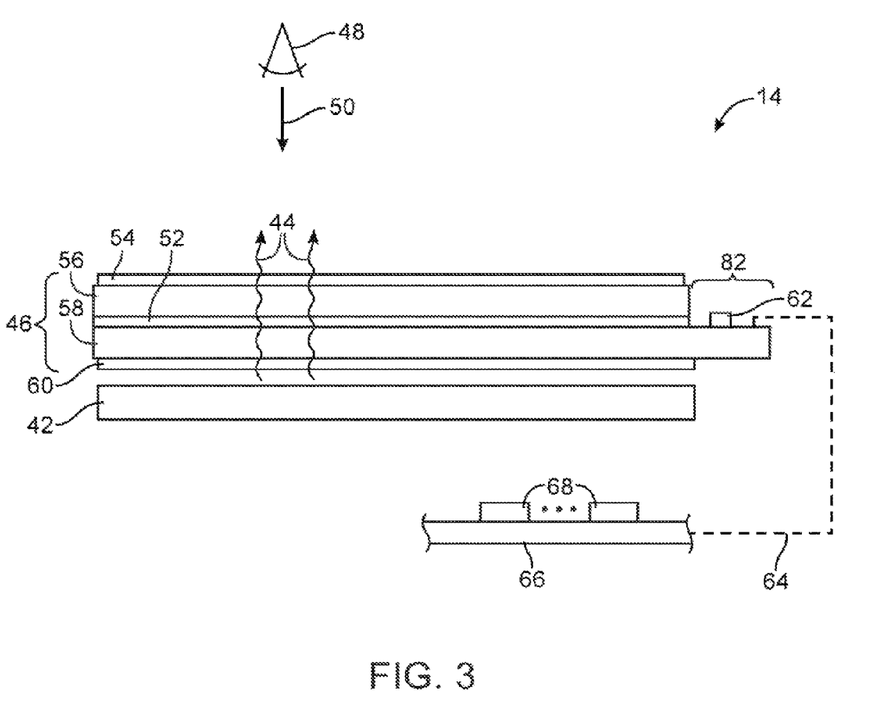
FIG. 3 is a cross-sectional side view of illustrative display components associated with a display in an electronic device such as a portable computer in accordance with an embodiment.

A cross-sectional side view of an illustrative configuration for display 14 of device 10 is shown in FIG. 3. As shown in FIG. 3, display 14 may include backlight structures such as backlight unit 42 for producing backlight 44. During operation, backlight 44 travels outwards (vertically upwards in the orientation of FIG. 3) and passes through display pixel structures (display pixels 40 of FIG. 2) in liquid crystal display layers 46 (sometimes referred to as a liquid crystal display module or liquid crystal display structures). This illuminates any images that are being produced by display pixels 40 of display 14 for viewing by a user. For example, backlight 44 illuminates images on display layers 46 that are being viewed by viewer 48 in direction 50. The images that are displayed may include moving image content (e.g., video clips, etc.) and/or static image content (text, graphics, photographs, etc.). Control circuitry 28 may use display circuitry such as timing controller 34 and driver circuitry 62 and 38 to display content on display pixels 40 of display 14.

Display layers 46 may be mounted in chassis structures such as a plastic chassis structure and/or a metal chassis structure to form a display structure for mounting in housing 12 or display layers 46 may be mounted directly in housing 12 (e.g., by stacking display layers 46 into a recessed portion in housing 12A).

Display layers 46 may form a liquid crystal display or may be used in forming displays of other types. In a liquid crystal display configuration, display layers 46 include a liquid crystal layer such a liquid crystal layer 52. Liquid crystal layer 52 is sandwiched between display layers such as display layers 58 and 56. Layers 56 and 58 are interposed between lower polarizer layer 60 and upper polarizer layer 54.

Layers 58 and 56 are formed from transparent substrate layers such as clear layers of glass or plastic. Layers 56 and 58 are layers such as a thin-film transistor layer (e.g., a thin-film-transistor substrate such as a glass layer coated with a layer of thin-film transistor circuitry) and/or a color filter layer (e.g., a color filter layer substrate such as a layer of glass having a layer of color filter elements such as red, blue, and green color filter elements arranged in an array). Conductive traces, color filter elements, transistors, and other circuits and structures are formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 is a thin-film transistor layer that includes an array of thin-film transistors and associated electrodes (display pixel electrodes) for applying electric fields to liquid crystal layer 52 and thereby displaying images on display 14. Layer 56 is a color filter layer that includes an array of color filter elements for providing display 14 with the ability to display color images. If desired, layer 58 may be a color filter layer and layer 56 may be a thin-film transistor layer. Layer 56 may, if desired, be a clear substrate or a substrate with a single color of color filter material (e.g., in configurations for display 14 in which display 14 is a monochrome display that displays monochrome images).

During operation of display 14 in device 10, control circuitry 28 and timing controller 34 (e.g., one or more integrated circuits such as components 68 on printed circuit 66 of FIG. 3 and/or other circuitry) is used to generate information to be displayed on display 14 (e.g., display data). The information to be displayed is conveyed from circuitry 68 to display driver circuitry such as one or more column driver integrated circuits 62 and gate driver circuitry on layer 58 using a signal path such as a signal path formed from conductive metal traces in printed circuit structures (shown as path 64 in FIG. 3).

Display driver circuitry such as display driver integrated circuit(s) 62 of FIG. 3 may be mounted on thin-film-transistor layer driver ledge 82 of thin-film transistor layer 58 or elsewhere in device 10.

The printed circuit structures that are used in forming path 64 may include rigid printed circuit board material (e.g., fiberglass-filled epoxy material such as FR4 rigid printed circuit board material) and flexible printed circuit material (e.g., printed circuits formed from layers of polyimide or sheets of other flexible polymers). With one suitable arrangement, which is sometimes described herein as an example, path 64 may be formed from integrally connected flexible printed circuit material and rigid printed circuit board material. In this type of printed circuit, which is sometimes referred to as a rigid flex printed circuit board or "rigid flex," one or more rigid printed circuit board regions have extending flexible tails. The rigid printed circuit board regions have multiple layers. The extending flexible tails are formed from a flexible subset of the layers in the rigid printed circuit board region. A rigid flex printed circuit may have one or more rigid printed circuit board areas and one or more sections of flexible printed circuit that are formed by extending a flexible subset of the layers of the rigid printed circuit board areas outwards from the rigid printed circuit board areas.

Figure 4:
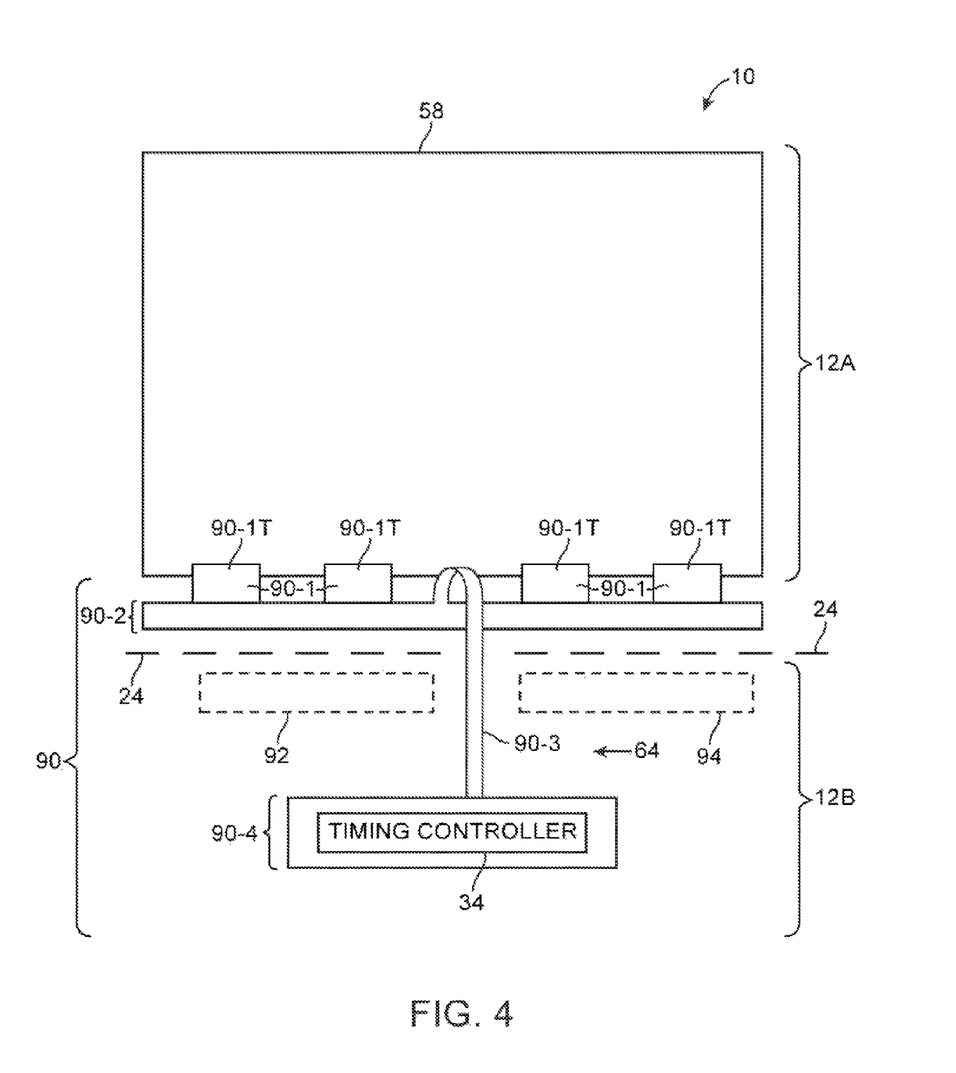
FIG. 4 is a top view of illustrative rigid flex printed circuit structures of the type that may be used to couple circuitry in a portable computer base to circuitry in a portable computer lid in accordance with an embodiment.

FIG. 4 is a diagram showing how display circuitry may be coupled to display layers such as thin-film transistor layer 58 using rigid flex communications paths. As shown in FIG. 4, rigid flex 90 may have one or more rigid printed circuit board portions such as rigid printed circuit board portions 90-2 and 90-4 and one or more flexible printed circuit portions that extend outwards from the rigid printed circuit board material such as flexible printed circuit portions 90-1 and 90-3. Structures such as flexible portion 90-3 may help form path 64 (e.g., a path that crosses hinge axis 24.

Integrated circuits for providing display control functions such as display timing controller integrated circuit 34 and/or other display control integrated circuits may be mounted on rigid printed circuit board portion 90-4 of rigid flex 90. Integrated circuit 34 may be mounted on rigid printed circuit board portion 90-4 using anisotropic conductive film, solder joints, or other conductive structures. If desired, rigid printed circuit board portion 90-4 may be used as a substrate for other control circuits in device 10 besides display control circuits such as timing controller 34. For example, rigid printed circuit board portion 90-4 may be used as a substrate for portions of control circuitry 28 of FIG. 2 and input-output circuitry 86.

Circuitry on rigid printed circuit board portion 90-4 may be directly coupled to a substrate such as a main logic board in base 12B or other printed circuit on which control circuitry 28 and input-output circuitry 86 have been mounted. A board-to-board connector or other coupling mechanism may be used in coupling rigid printed circuit board portion 90-4 or a flexible printed circuit portion of rigid flex 90 to the substrate in base 12B. Alternatively, or in addition to using direct coupling schemes, a flexible printed circuit jumper or other cable may be used to couple integrated circuits and other components on rigid printed circuit board portion 90-4 to a substrate such as a main logic board or other printed circuit.

Rigid printed circuit board portions of rigid flex 90 such as rigid printed circuit board portions 90-2 and 90-4 may have one or more layers of signal lines formed from patterned metal traces. For example, rigid printed circuit board portions 90-2 and 90-4 may contain two or more signal trace layers, three or more signal traces layers, may be four layer boards, 8 layer boards, or 10 layer boards, etc. Layers of dielectric printed circuit board material may separate the layers of signal traces. Particularly in scenarios in which flexible printed circuit portions 90-1 and 90-3 of rigid flex 90 contain a relatively small number of signal layers (e.g., when portions 90-1 and 90-3 are single-signal-line-layer flexible printed circuits), the use of multilayer printed circuit board material for forming rigid printed circuit board portions 90-2 and 90-4 can help enhance signal line density in the rigid printed circuit board portions 90-2 and 90-4 relative to the flexible printed circuit board portions. The use of relatively dense multilayer structures for forming rigid portions 90-2 and 90-4 can reduce the widths and lengths of board portions 90-2 and 90-4 and can therefore help minimize the amount of space that is consumed by rigid flex 90 within housing 12.

As shown in FIG. 4, flexible printed circuit portions 90-1 may form a series of four tails (or more tails or fewer tails) that extend from rigid printed circuit board portion 90-2. Tips 90-1T of flexible printed circuit portions 90-1 may be attached to metal traces within liquid crystal display layers 46. For example, tips 90-1T may each contain metal signal lines that are coupled to mating metal signal lines in thin-film transistor layer 58. Anisotropic conductive film, solder connections, or other suitable electrical connections may be used in coupling the signal lines in tips 90-1T to corresponding signal lines on layer 58.

Rigid printed circuit board portion 90-2 may have the shape of an elongated strip that runs along the edge of display layers such as thin-film transistor layer 58. Rigid printed circuit board portion 90-2 of rigid flex 90 and flexible printed circuit portions 90-1T of rigid flex 90 may be mounted within lid 12A of housing 12.

Flexible printed circuit portion 90-3 may extend between rigid printed circuit board portion 90-2 in lid 12A and rigid printed circuit board portion 90-4 in base 12B of housing 12. Flexible printed circuit portion 90-3 may have the shape of a thin strip that lies within the center of device 10 (laterally midway between the left and right edges of device 10 as flexible printed circuit portion 90-3 passes through the hinge at the intersection between lid 12A and base 12B) or may have another shape and be located elsewhere in device 10. In configurations of the type shown in FIG. 4 in which flexible printed circuit portion 90-3 is located midway between the left and right edges of device 10, antennas may be formed to the right and left of flexible printed circuit portion 90-3. As an example, a first antenna such as antenna 92 may be located to the left of flexible printed circuit portion 90-3 and a second antenna such as antenna 94 may be formed to the right of flexible printed circuit portion 90-3.

Figure 5:
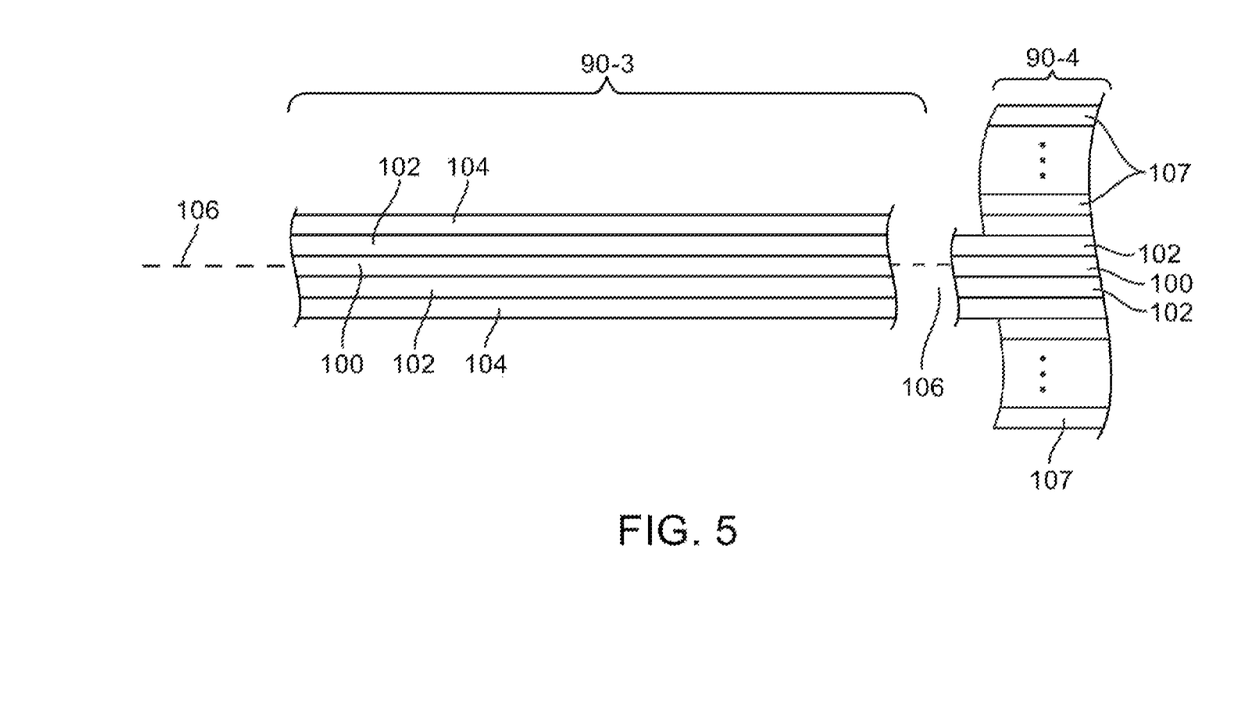
FIG. 5 is a cross-sectional side view of a portion of an illustrative rigid flex printed circuit cable structure of the type that may be used to minimize stress effects when the flexible portion of the cable structure is bent during opening and closing of a portable computer in accordance with an embodiment.

Flexible printed circuit portion 90-3 may be used in forming signal path 64 between integrated circuit 34 and the driver circuitry on thin-film transistor layer 58. Flexible printed circuit portion 90-3 (e.g., the section of portion 90-3 that traverses hinge axis 24) may be flexed back and forth as lid 12A is opened and closed relative to base 12B. To prevent signal line cracking and other undesired damage to the metal traces of flexible printed circuit portion 90-3, it may be desirable to form flexible printed circuit portion 90-3 using a single layer of patterned metal signal line traces. As shown in FIG. 5, for example, flexible printed circuit portion 90-3 (and, if desired, flexible printed circuit portions 90-1) may be formed from a single patterned layer of metal traces such as metal signal line layer 100. Layer 100 may include differential pairs for carrying display data, power lines, and lines for carrying other control, data, and power signals.

Metal signal line layer 100 of flexible printed circuit portion 90-3 of rigid flex 90 may have dielectric layers such as layers 102. Metal signal line layer 100 may be sandwiched between respective upper and lower layers 102. Layers 102 may be formed from a dielectric such as polyimide or other flexible polymer. Electromagnetic shielding may be provided by incorporating upper and lower metal layers 104 onto the respective upper and lower surfaces of polymer layers 102. For example, layers 104 may be silver layers or other metal layers that serve as electromagnetic interference shielding for metal signal line layer 100. When a single-signal-line-layer flexible printed circuit is provided with opposing outer layers of shielding metal, the flexible printed circuit may sometimes be referred to as a double-shield-layer single-signal-line-layer flexible printed circuit. By providing shielding on the upper and lower surfaces of the flexible printed circuit portion of the rigid flex that traverses the area occupied by the antennas in device 10, interference between signals generated by display 14 and signals associated with the operation of the antennas can be minimized.

The amount of stress that is induced in the traces of metal signal line layer 100 when portion 90-3 is bent may be minimized by aligning metal signal line layer 100 with neutral stress plane 106. This may be accomplished by configuring the upper and lower layers on metal signal line layer 100 so that the amount of compressive stress in layer 100 that is produced by one set of layers is balanced by an equal amount of tensile stress in layer 100 being produced by the other set of layers. As an example, if portion 90-3 is bent downwards, tensile stress will be produced in the layers above layer 100 and compressive stress will be produced in the layers below layer 100. By locating metal signal line layer 100 in neutral stress plane 106, metal signal line layer 100 will be placed under neither tensile stress nor compressive stress as a result of the bending.

With one illustrative configuration, neutral stress plane 106 can be aligned with metal signal line layer 100 by forming layers 102 above and below metal signal line layer 100 from polyimide or other polymer layers of equal thickness and by forming layers 104 above and below layers 102 using silver or other metal coating layers of equal thickness.

FIG. 5 shows how the flexible layers of flexible printed circuit portion 90-3 extend outwardly (to the left in the orientation of FIG. 5) from the larger number of layers used in forming rigid printed circuit board portion 90-4. Additional printed circuit board layers such as additional layers of signal lines and additional rigid printed circuit board dielectric can be provided above and below the flexible printed circuit layers. These additional layers in rigid printed circuit portion 90-4 are shown as layers 107 in the example of FIG. 5.

As shown in FIG. 4, flexile printed circuit portion 90-3 can extend as a flexible tail from both rigid portion 90-2 and from rigid portion 90-2. Similarly, flexible printed circuit portions 90-1T may extend in an integral fashion from rigid printed circuit portion 90-2.

Figure 6:
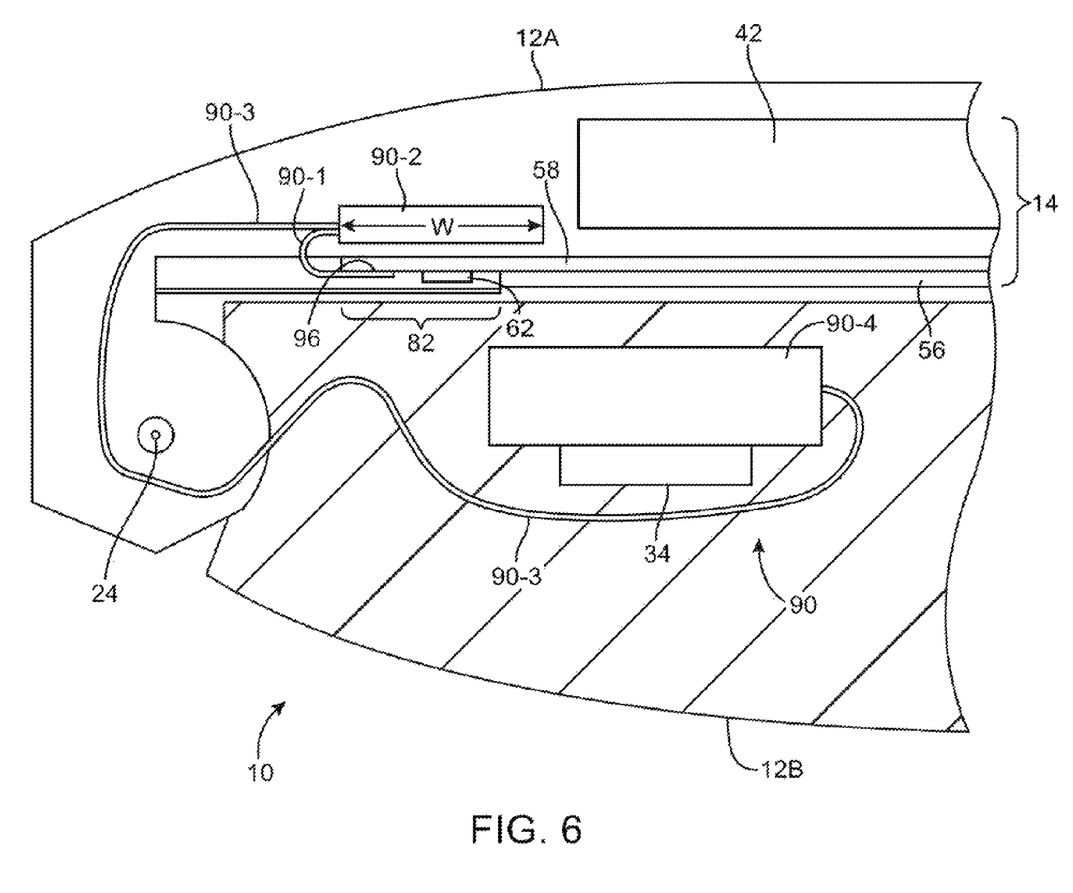
FIG. 6 is a cross-sectional end view of a hinge portion of a portable computer in a closed position showing how a rigid flex printed circuit can be used to route signals between a timing controller integrated circuit in a base of the portable computer to display driver circuits such as column drivers mounted on a thin-film transistor layer in a display in a lid of the portable computer in accordance with an embodiment.

FIG. 6 is a cross-sectional side view of a portion of device 10 in the vicinity of hinge axis 24 when device 10 is in a closed lid configuration. As shown in FIG. 6, display control integrated circuits such as timing controller integrated circuit 34 may be mounted on the lower surface of rigid printed circuit board portion 90-4 of rigid flex 90 (in the orientation of FIG. 6). Flexible printed circuit portion 90-3 of rigid flex 90 may bridge hinge axis 24 between base 12B and lid 12A. For example, a single flexible printed circuit segment such as portion 90-3 may traverse the hinge axis a single time. Flexible printed circuit portion 90-3 may be formed from a thin flexible structure of the type described in connection with FIG. 5 to allow flexible printed circuit portion 90-3 to bend without damage, thereby accommodating relative movement between lid 12A and base 12B.

Display driver circuitry such as column driver integrated circuit(s) 62 may be mounted on ledge portion 82 of thin-film transistor layer 58 (e.g., column driver integrated circuit(s) 62 may be mounted so as to face downward in the orientation of FIG. 6). Flexible printed circuit portion 90-1 of rigid flex 90 may extend between rigid printed circuit board portion 90-2 of rigid flex 90 and metal traces on ledge 82 of thin-film transistor layer 58. Flexible printed circuit portion 90-1 may be sufficiently flexible to form a 180° bend, as shown in FIG. 6. Conductive bonding material 96 such as anisotropic conductive film or other conductive structures may be used in coupling the metal traces of flexible printed circuit portion 90-1 of rigid flex 90 to the traces on thin-film transistor substrate 58.

Rigid printed circuit board portion 90-2 of rigid flex 90 may contain multiple layers of metal signal lines (e.g., two or more, four or more, eight or more, or ten or more). By incorporating a sufficient number of metal signal line layers in rigid printed circuit board portion 90-2, a relatively large number of interconnect paths can be formed in rigid printed circuit board portion 90-2 while minimizing board width W. By minimizing board width W, more room may be made available within lid 12A to accommodate backlight unit 42 in display 14.

Figure 7:
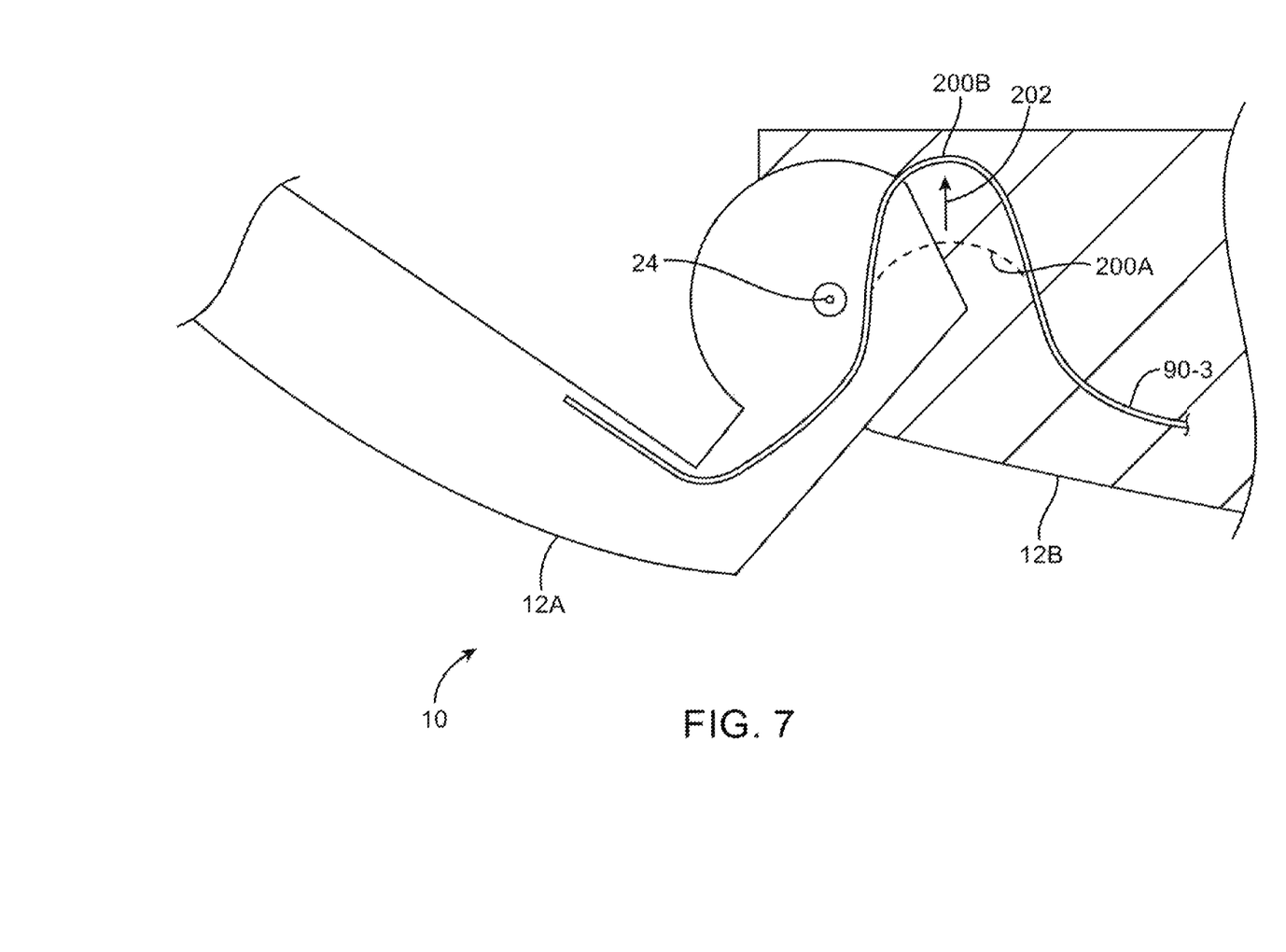
FIG. 7 is a cross-sectional end view of the hinge portion of the portable computer of FIG. 6 in an open position showing how a flexible length of the rigid flex printed circuit can bend to accommodate opening of the lid of the portable computer in accordance with an embodiment.

FIG. 7 is a cross-sectional side view of the hinge portion of device 10 where lid 12A has been placed in an open configuration. As shown in FIG. 7, flexible printed circuit portion 90-3 of rigid flex 90 may move in direction 202 from a first position such as position 200A to a second position such as position 200B to accommodate the relative movement between lid 12A and base 12B. By using a single-signal-line-layer flexible printed circuit (sometimes referred to as "single flex") and by using a configuration in which the neutral stress plane of the flexible printed circuit is aligned with the single layer of signal lines, stress in the signal lines of flexible printed circuit portion 90-3 may be minimized during lid movement relative to base 12B. This can help avoid damage to the signal lines in flexible printed circuit portion 90-3 due to stress-induced cracks, thereby preventing failure of rigid flex 90.

If desired, rigid flex 90 may have a different number of flexible printed circuit portions, may have one or more flexible printed circuit portions that traverse the hinge between lid 12A and base 12B in one or more different locations from the center location of flexible printed circuit portion 90-3 in FIG. 4, or may have a different number of rigid printed circuit board portions. Flexible printed circuits (i.e., printed circuits without any rigid printed circuit board regions) may also be used for distributing signals between control and display circuitry in base 12B and display driver circuitry for display 14 in lid 12A, if desired.

The foregoing is merely illustrative of the principles of this invention and various modifications can be made by those skilled in the art without departing from the scope and spirit of the invention.

What is claimed is:

1. An electronic device, comprising:
    a housing having a base and having a lid that rotates relative to the base; and
    a rigid flex printed circuit having a first rigid printed circuit board portion in the lid, a second rigid printed circuit board portion in the base, a flexible printed circuit portion that extends between the first rigid printed circuit board portion and the second rigid printed circuit board portion, and a metal signal line layer that forms part of the first rigid printed circuit board portion, the second rigid printed circuit board portion, and the flexible printed circuit portion.

2. The electronic device defined in claim 1 further comprising a display in the lid.

3. The electronic device defined in claim 2 wherein the display comprises:
    liquid crystal display layers; and
    a backlight unit, wherein the rigid flex printed circuit has a flexible printed circuit portion that extends between the first rigid printed circuit board portion and the liquid crystal display layers.

4. The electronic device defined in claim 3 wherein the liquid crystal display layers include a thin-film transistor layer, wherein the display further comprises at least one column driver integrated circuit mounted on the thin-film transistor layer, and wherein the flexible printed circuit board portion that extends between the first rigid printed circuit board portion and the liquid crystal display layers is attached to the thin-film transistor layer.

5. The electronic device defined in claim 4 further comprising a display timing controller integrated circuit mounted on the second rigid printed circuit board portion in the base.

6. The electronic device defined in claim 5 wherein the flexible printed circuit portion that extends between the first rigid printed circuit board portion and the second rigid printed circuit portion comprises a single-signal-line-layer flexible printed circuit.

7. The electronic device defined in claim 6 wherein the flexible printed circuit portion that extends between the first rigid printed circuit board portion and the second rigid printed circuit board portion has opposing outer layers of shielding metal that provide electromagnetic shielding.

8. The electronic device defined in claim 7 wherein the flexible printed circuit portion that extends between the first rigid printed circuit board portion and the second rigid printed circuit board portion has a single layer of metal signal lines and has a neutral stress plane aligned with the single layer of metal signal lines.

9. A portable computer, comprising:
    a housing having a first housing portion and having a second housing portion that rotates relative to the first housing portion about a hinge axis;
    a display in the first housing portion;
    a printed circuit that is coupled to the display in the first housing portion, wherein the printed circuit comprises a first rigid printed circuit board portion in the first housing portion, a second rigid printed circuit board portion in the second housing portion, a flexible printed circuit portion that traverses the hinge axis and extends between the first rigid printed circuit board portion and the second rigid printed circuit board portion, and a metal signal line layer that forms part of the first rigid printed circuit board portion, the second rigid printed circuit board portion, and the flexible printed circuit portion; and
    a display timing controller integrated circuit mounted on the second rigid printed circuit board portion in the second housing portion.

10. The portable computer defined in claim 9 wherein the flexible printed circuit portion comprises a single-signal-line-layer flexible printed circuit.

11. The portable computer defined in claim 9 wherein the flexible printed circuit portion comprises a double-shield-layer single-signal-line-layer flexible printed circuit.

12. The portable computer defined in claim 9 wherein the display comprises display layers and a display driver integrated circuit mounted to one of the display layers.

13. A portable computer, comprising:
    a housing having a lid that rotates relative to a base;
    a display in the lid;
    display driver circuitry coupled to the display in the lid;
    display control circuitry in the base; and
    a printed circuit to which the display control circuitry is mounted, wherein the printed circuit is coupled between the display control circuitry in the base and the display driver circuitry, and wherein the printed circuit comprises a first rigid printed circuit board portion in the base, a first flexible printed circuit portion that extends between the first rigid printed circuit board portion and the display driver circuitry, and a metal signal line layer that forms part of both the first rigid printed circuit board portion and the first flexible printed circuit portion.

14. The portable computer defined in claim 13 wherein the display comprises a substrate layer and wherein the display driver circuitry comprises a column driver integrated circuit mounted to the substrate layer.

15. The portable computer defined in claim 14 wherein the printed circuit comprises a rigid flex printed circuit.

16. The portable computer defined in claim 15 wherein the display control circuitry comprises a display timing controller integrated circuit mounted on the printed circuit.

17. The portable computer defined in claim 16 wherein the printed circuit further comprises:
   a second rigid printed circuit board portion in the lid, wherein the display timing controller integrated circuit is mounted to the first rigid printed circuit board portion in the base.

18. The portable computer defined in claim 17 wherein the printed circuit further comprises:
   a second flexible printed circuit portion that extends between the first rigid printed circuit board portion and the substrate layer, wherein the first flexible printed circuit portion extends between the first and second rigid printed circuit board portions.

19. The portable computer defined in claim 18 wherein the first flexible printed circuit portion has opposing outer metal shielding layers.

\* \* \* \* \*